US012804917B2

(12) United States Patent
Zhang et al.

(10) Patent No.: US 12,804,917 B2
(45) Date of Patent: Nov. 17, 2026

(54) MIM CAPACITOR STRUCTURE AND FABRICATING METHOD OF THE SAME

(71) Applicant: UNITED MICROELECTRONICS CORP., Hsin-Chu City (TW)

(72) Inventors: Wen-Wen Zhang, Changhua County (TW); Bo-Han Huang, Chiayi County (TW); Dien-Yang Lu, Kaohsiung City (TW); Kun-Chen Ho, Tainan City (TW); Chung-Yi Chiu, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 337 days.

(21) Appl. No.: 18/796,324

(22) Filed: Aug. 7, 2024

(65) Prior Publication Data

US 2026/0020265 A1 Jan. 15, 2026

(30) Foreign Application Priority Data

Jul. 15, 2024 (TW) ................................ 113126421

(51) Int. Cl.
*H10D 1/68* (2025.01)
*H10W 20/00* (2026.01)
(Continued)

(52) U.S. Cl.
CPC ............. *H10D 1/714* (2025.01); *H10D 1/696* (2025.01); *H10W 20/083* (2026.01);
(Continued)

(58) Field of Classification Search
CPC .......... H10D 1/714; H10D 1/68; H10D 1/696; H10W 20/083; H10W 20/00;
(Continued)

(56) References Cited

U.S. PATENT DOCUMENTS

| | | | |
|---|---|---|---|
| 11,145,592 | B2 | 10/2021 | Shen |
| 11,688,759 | B2 | 6/2023 | Shen |
| 2022/0139914 | A1 | 5/2022 | Cheng |

FOREIGN PATENT DOCUMENTS

| | | | |
|---|---|---|---|
| CN | 111261591 | A | 6/2020 |
| CN | 113725206 | A | 11/2021 |

(Continued)

*Primary Examiner* — Nikolay K Yushin
(74) *Attorney, Agent, or Firm* — Winston Hsu

(57) ABSTRACT

An MIM capacitor structure includes a dielectric layer. An MIM capacitor body is disposed on the dielectric layer. The MIM capacitor body includes a first electrode and a second electrode stacked alternately and a capacitor dielectric layer disposed between the first electrode and the second electrode. The first electrode has a first extension part extending out from the MIM capacitor body. The second electrode has a second extension part extending out from the MIM capacitor body. The first extension part includes a first aluminum-containing material layer. The second extension part includes a second aluminum-containing material layer. A first conductive plug penetrates the first extension part, wherein the first conductive plug has a first arc which is concave toward the first aluminum-containing material layer. A second conductive plug penetrates the second extension part, wherein the second conductive plug has a second arc which is concave toward the second aluminum-containing material layer.

16 Claims, 7 Drawing Sheets

(51) Int. Cl.
*H10W 20/40* (2026.01)
*H10W 20/41* (2026.01)
*H10W 20/43* (2026.01)

(52) U.S. Cl.
CPC ......... *H10W 20/425* (2026.01); *H10W 20/43* (2026.01); *H10W 20/496* (2026.01)

(58) Field of Classification Search
CPC ... H10W 20/425; H10W 20/41; H10W 20/43; H10W 20/496
See application file for complete search history.

(56) References Cited

FOREIGN PATENT DOCUMENTS

| | | | |
|---|---|---|---|
| TW | 202111863 | A | 3/2021 |
| TW | 202232661 | A | 8/2022 |
| TW | 202234590 | A | 9/2022 |

MIM CAPACITOR STRUCTURE AND FABRICATING METHOD OF THE SAME

BACKGROUND OF THE INVENTION

1. Field of the Invention

The present invention relates to a metal-insulator-metal (MIM) capacitor structure, and more particularly, it relates to an MIM capacitor structure that reduces contact resistance between a capacitor electrode and a conductive plug.

2. Description of the Prior Art

In recent years, with the development of semiconductor integrated circuit process technology, the size of components on semiconductor substrates has gradually become smaller, and the density of integrated circuits per unit area has also become higher. However, due to the increase in the density of memory cells, the space occupied by the capacitors for charge storage becomes smaller. Therefore, it is necessary to develop capacitors with small size but high capacitance. Under high density, sufficient capacitance can be obtained by using metal-insulator-metal (MIM) capacitors. This is one of the advantages of MIM capacitors. MIM capacitors are not only used to filter noise in radio frequency circuits, or used as load components in digital electronics, but are also widely used in general integrated circuit and circuit board manufacturing processes.

SUMMARY OF THE INVENTION

In view of this, the present invention provides an MIM capacitor structure that has lower contact resistance between the conductive plug and the electrode, thereby increasing the performance of the MIM capacitor.

According to a preferred embodiment of the present invention, an MIM capacitor structure includes a dielectric layer. An MIM capacitor body is disposed on the dielectric layer, wherein the MIM capacitor body includes a first electrode and a second electrode stacked alternately. A capacitor dielectric layer is disposed between the first electrode and the second electrode. The first electrode has a first extension part extending out from the MIM capacitor body, and the second electrode has a second extension part extending out from the MIM capacitor body. The first extension part includes a first aluminum-containing material layer, and the second extension part includes a second aluminum-containing material layer. A first conductive plug penetrates the first extension part. The first conductive plug has a first arc which is concave toward the first aluminum-containing material layer. A second conductive plug penetrates the second extension part, wherein the second conductive plug has a second arc which is concave toward the second aluminum-containing material layer.

According to another preferred embodiment of the present invention, a fabricating method of an MIM capacitor structure includes forming an MIM capacitor body, wherein the MIM capacitor body includes a first electrode and a second electrode stacked alternately. A capacitor dielectric layer is disposed between the first electrode and the second electrode. The first electrode has a first extension part extending out from the MIM capacitor body, and the second electrode has a second extension part extending out from the MIM capacitor body, the first extension part includes a first aluminum-containing material layer, and the second extension part includes a second aluminum-containing material layer. Next, a dielectric layer is formed to cover the MIM capacitor body, the first extension part and the second extension part. Then, a dry etching is performed to form a first via hole and a second via hole, the first via hole penetrates through the dielectric layer, the first extension part and the capacitor dielectric layer, and the second via hole penetrates through the dielectric layer, the second extension part and the capacitor dielectric layer. After that, a wet etching is performed to etch the first aluminum-containing material layer and the second aluminum-containing material layer to form a first arc in the first aluminum-containing material layer which is concave toward the first aluminum-containing material layer, and to form a second arc in the second aluminum-containing material layer which is concave toward the second aluminum-containing material layer. Finally, a conductive layer is formed to fill the first via hole and the second via hole.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 depict a fabricating method of an MIM capacitor structure according to a preferred embodiment of the present invention, wherein:

FIG. 2 is a fabricating step in continuous of FIG. 1;

FIG. 3 is a fabricating step in continuous of FIG. 2;

FIG. 4 depicts an enlarged view of a first arc in an area A in FIG. 3;

FIG. 5 is a fabricating step in continuous of FIG. 3;

FIG. 6 depicts a partial enlarged view of a first conductive plug in an area B of FIG. 5; and FIG. 7 is a fabricating step in continuous of FIG. 5.

DETAILED DESCRIPTION

FIG. 1 to FIG. 7 depict a fabricating method of an MIM capacitor structure according to a preferred embodiment of the present invention.

Figure 1:
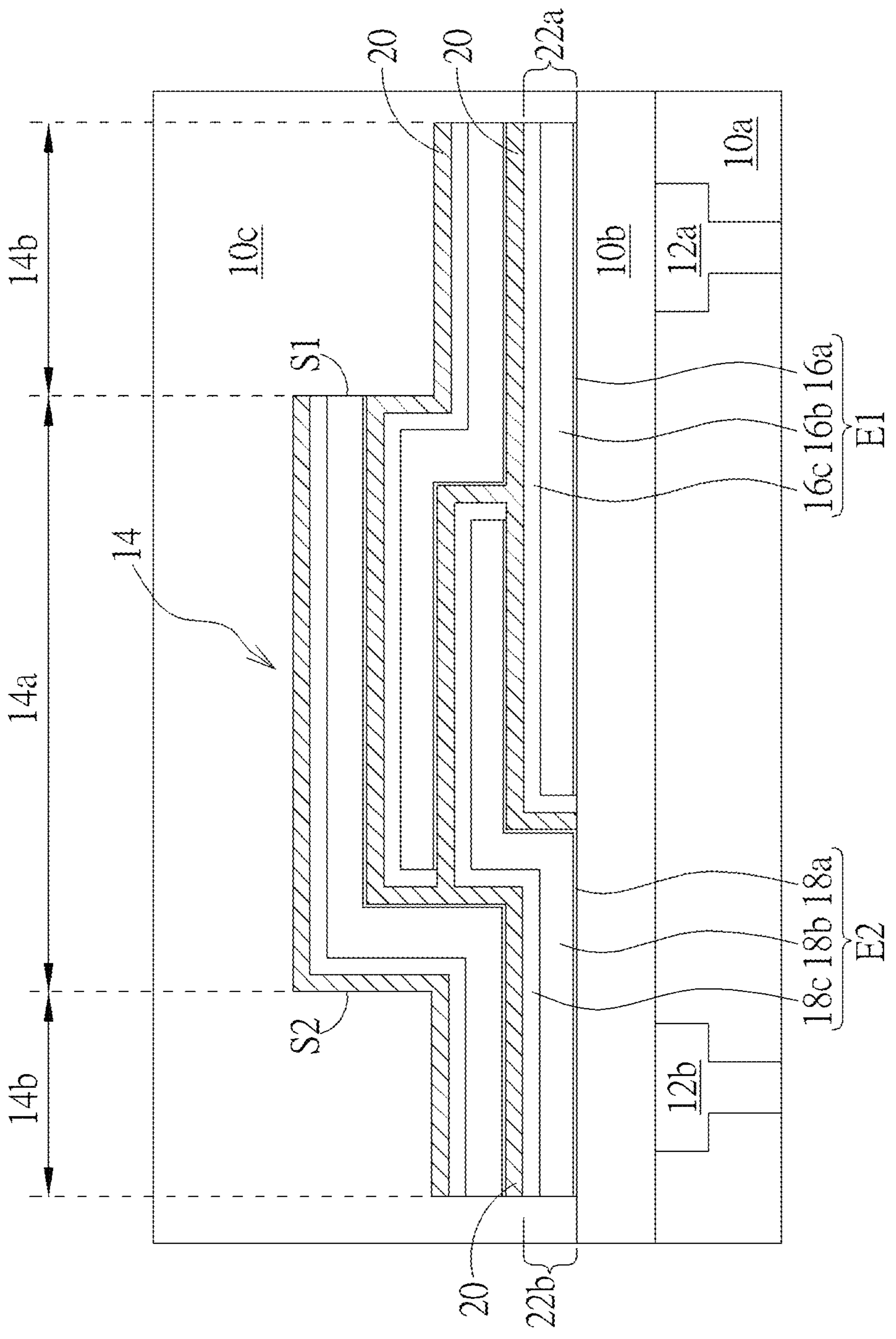

As shown in FIG. 1, first a substrate (not shown) is provided. The substrate may include a semiconductor substrate. A transistor (not shown) is disposed on the substrate. Then, several dielectric layers are formed to cover the substrate. Metal interconnections made by the front end of line process and metal interconnections made by the back end of line process are disposed in the dielectric layers. For example, the dielectric layer 10*a* covers the substrate, and metal interconnections 12*a*/12*b* formed by the back end of line process are disposed in the dielectric layer 10*a*. Then, a dielectric layer 10*b* is formed to cover the dielectric layer 10*a*. Thereafter, an MIM capacitor 14 is formed on the dielectric layer 10*b*. The fabricating method of the MIM capacitor 14 includes forming a patterned first electrode E1 first. Later, a capacitor dielectric layer 20 is formed to cover the first electrode E1. Next, a second electrode E2 is formed to cover the capacitor dielectric layer 20. Thereafter, the second electrode E2 is patterned. The steps of forming and patterning the first electrode E1, the capacitor dielectric layer 20 and the second electrode E2 can be repeated according to different product requirements. The MIM capacitor 14 can be divided into a MIM capacitor body 14*a* and a capacitor extension part 14*b*. The MIM capacitor body 14 includes a first electrode E1 and a second electrode E2 stacked alternately at least once. The MIM capacitor body 14 also includes a capacitor dielectric layer 20 disposed between the first electrode E1 and the second electrode E2. In this embodiment, the first electrode E1 and the second electrode E2 are stacked alternately several times, therefore, there are numerous first electrodes E1 and the second electrodes E2 in the MIM capacitor body 14a.

The capacitor extension part 14b includes the first electrode E1 and the capacitor dielectric layer 20 extending from the first side S1 of the MIM capacitor body 14a, and the second electrode E2 and the capacitor dielectric layer 20 extending from the second side S2 of the MIM capacitor body 14a. The first side S1 and the second side S2 are opposite to each other. In details, the first electrode E1 in the capacitor extension part 14b is defined as a first extension part 22a. The first extension part 22a extends from the first side S1 of the MIM capacitor body 14a. The second electrode E2 in the capacitor extension part 14b is defined as a second extension part 22b. The second extension part 22b extends from the second side S2 of the MIM capacitor body 14a. Since there are numerous first electrodes E1, there are numerous first extension parts 22a at the first side S1 of the MIM capacitor body 14a. Furthermore, there is no second extension part 22b at the first side S1. The capacitor dielectric layer 20 at the first side S1 contacts two adjacent first extension parts 22a. Similarly, there are numerous second extension parts 22b at the second side S2 of the MIM capacitor body 14a. But, there is no first extension part 22a at the second side S2. The capacitor dielectric layer 20 at the second side S2 contacts two adjacent second extension parts 22b.

According to a preferred embodiment of the present invention, the first electrode E1 includes a first aluminum-containing material layer 16b, a titanium nitride layer 16a and a titanium nitride layer 16c. The titanium nitride layer 16c covers the top surface and sidewalls of the first aluminum-containing material layer 16b. The titanium nitride layer 16a covers the bottom surface of the first aluminum-containing material layer 16b. The titanium nitride layer 16a is thinner than the titanium nitride layer 16c. According to another preferred embodiment of the present invention, the first electrode E1 may only be formed by the first aluminum-containing material layer 16b. Similarly, the second electrode E2 includes a second aluminum-containing material layer 18b, a titanium nitride layer 18a and a titanium nitride layer 18c. The titanium nitride layer 18c covers the top surface and sidewalls of the second aluminum-containing material layer 18b. The titanium nitride layer 18a covers the bottom surface of the second aluminum-containing material layer 18b. The titanium nitride layer 18a is thinner than the titanium nitride layer 18c. The second electrode E2 may also be formed only by the second aluminum-containing material layer 18b.

The first extension part 22a and the first electrode E1 have the same structure. The second extension part 22b and the second electrode E2 have the same structure. Therefore, the first extension part 22a includes the first aluminum-containing material layer 14b, the titanium nitride layer 16a, and the titanium nitride layer 16b. The second extension 22b includes a second aluminum-containing material layer 18b, a titanium nitride layer 18a, and a titanium nitride layer 18c. Next, a dielectric layer 10c is formed to cover the MIM capacitor body 14a, the first extension part 22a and the second extension part 22b.

Figure 2:
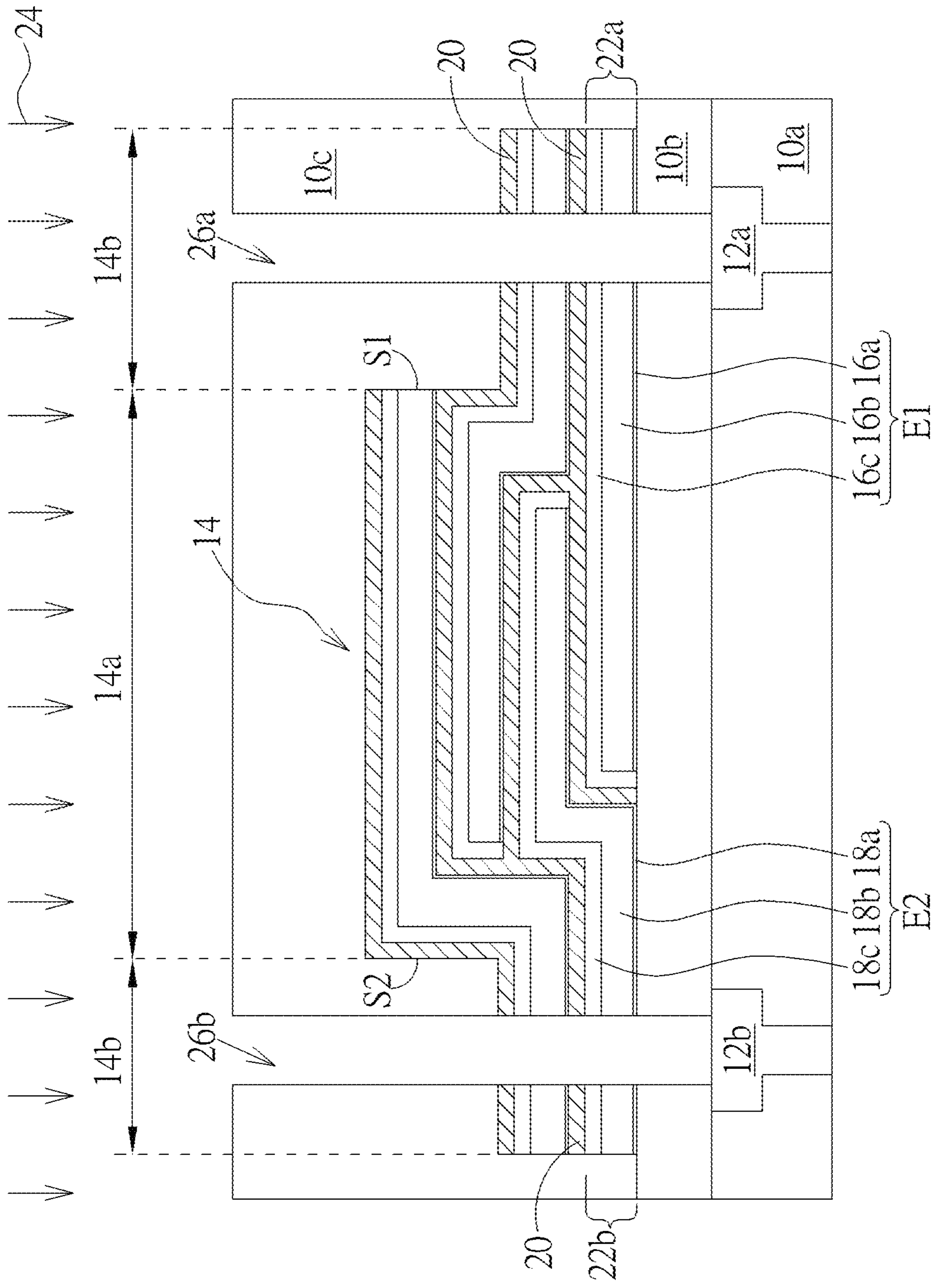

As shown in FIG. 2, a dry etching 24 is performed to form a first via hole 26a and a second via hole 26b. The first via hole 26a penetrates through the dielectric layer 10c, each first extension part 22a, the capacitor dielectric layer 20 and the dielectric layer 10b. The second via hole 26a penetrates through the dielectric layer 10c, each second extension part 22b, the capacitor dielectric layer 20 and the dielectric layer 10b. Now, the metal interconnection 12a is exposed through the first via hole 26a, and the metal interconnection 12b is exposed through the second via hole 26b. The dry etching 24 includes etching the dielectric layer 10c by using a fluorine-containing gas as an etchant. Then, the fluorine-containing gas is turned off. Later, the chlorine-containing gas is used as an etchant to etch the first extension parts 22a, the capacitor dielectric layer 20 and the second extension parts 22b. After that, the chlorine-containing gas is turned off and the fluorine-containing gas is turned on again to etch the dielectric layer 10b.

Figure 3:
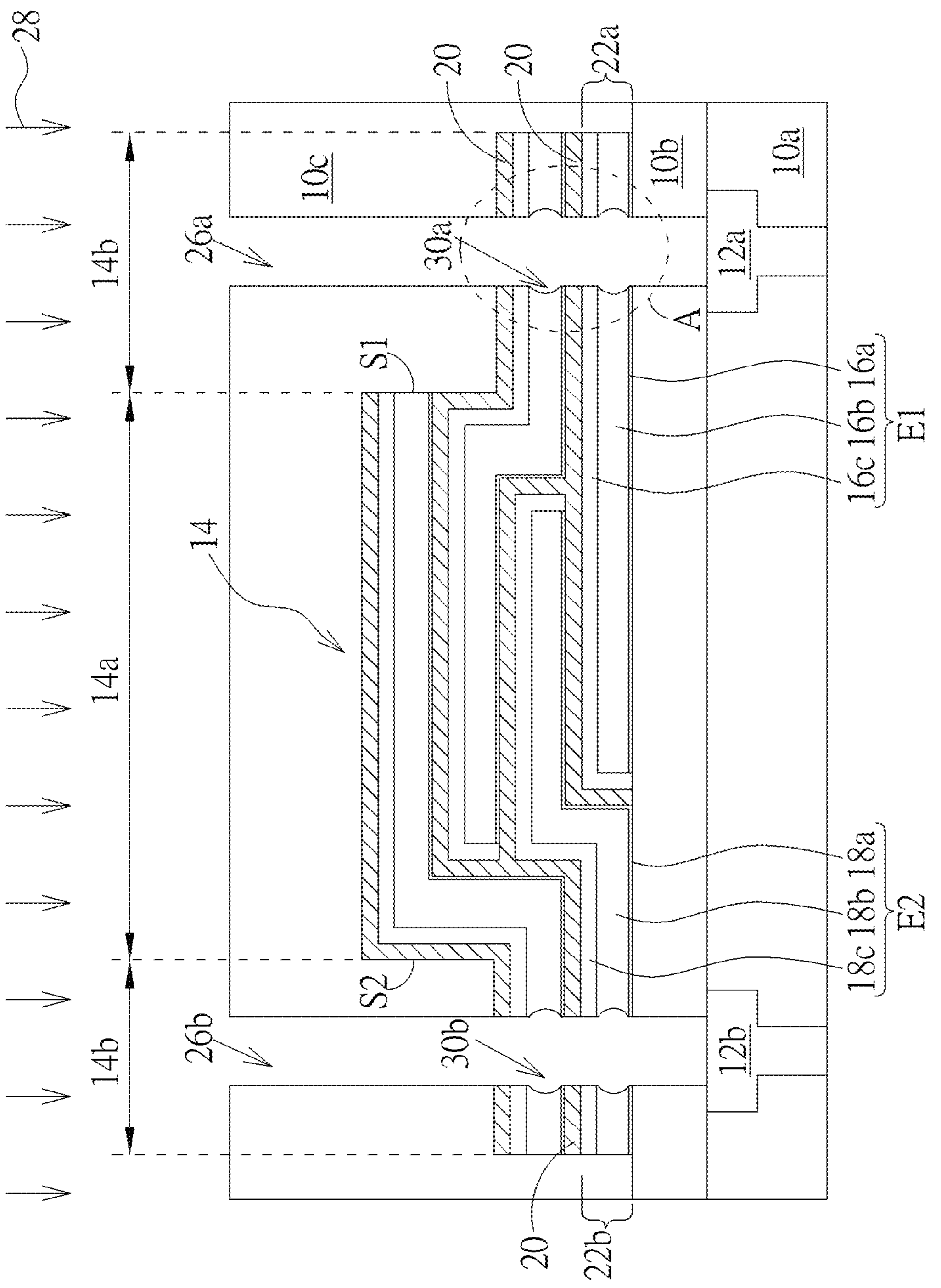

As shown in FIG. 3, a wet etching 28 is performed to etch the first aluminum-containing material layer 16b in each first extension part 22a and the second aluminum-containing material layer 18b in each second extension part 22b. The wet etching 28 only etches the aluminum-containing material layer, so that a first arc 30a is formed in each first aluminum-containing material layer 16b and the first arc 30a is concave toward the first aluminum-containing material layer 16b. A second arc 30b is formed in each second aluminum-containing material layer 18b, and the second arc 30b is concave toward the second aluminum-containing material layer 18b. The concavity of the first arc 30a and the second arc 30b can be controlled by time of the wet etching 28. According to a preferred embodiment of the present invention, an etchant used in the wet etching includes alkali solution, amine solution, ACT solution, EKC solution or SC1 cleaning solution.

Figure 4:
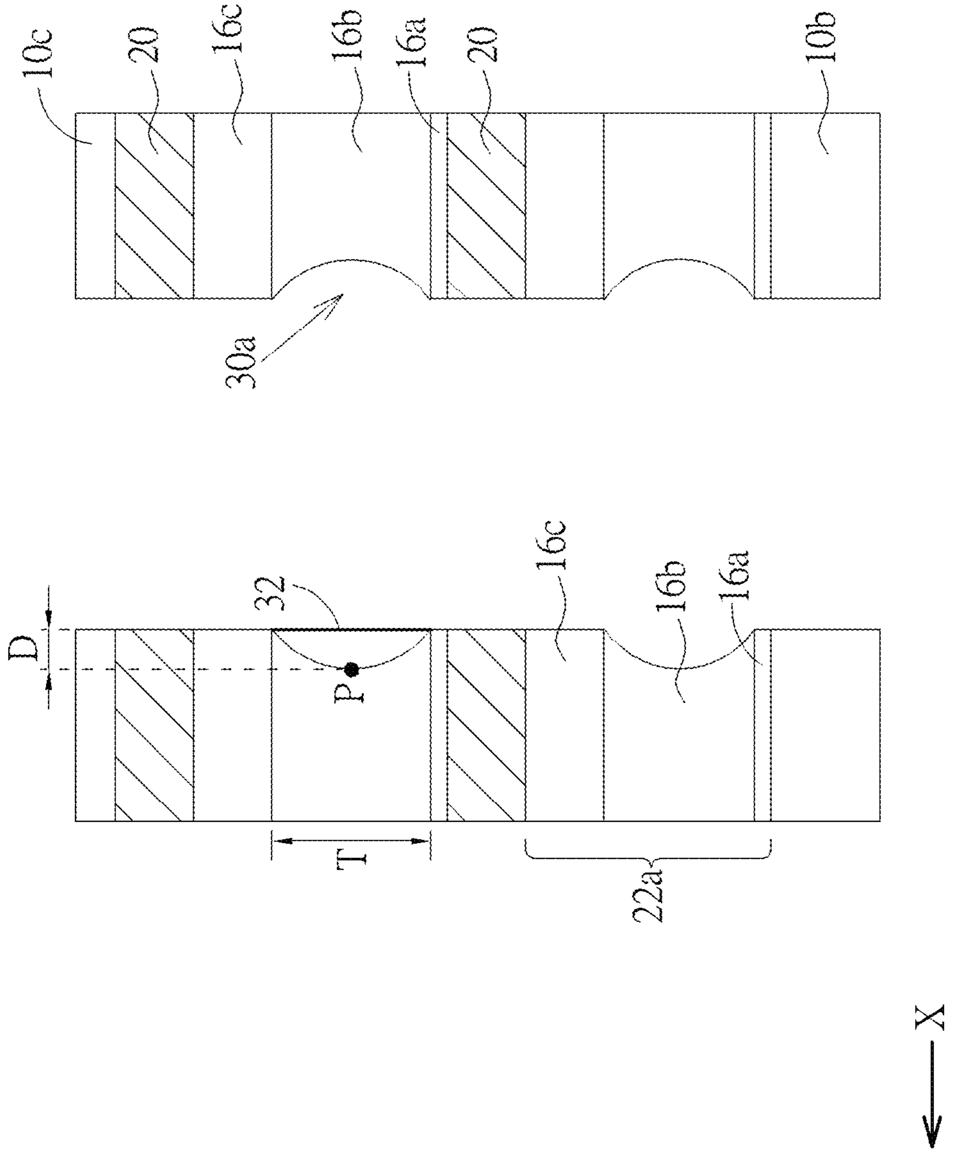

FIG. 4 depicts an enlarged view of the first arc 30a in an area A of FIG. 3. The second arc 30b and the first arc 30a have the same structure, so please refer to FIG. 4 for the profile of the second arc 30b. As shown in FIG. 4, a horizontal direction X is parallel to the top surface of the dielectric layer 10b. The first arc 30a has a cord 32. Along the horizontal direction X, the first arc 30a has a position P which is most concave to the first aluminum-containing material layer 16b. Along the horizontal direction X, there is a distance D between the position P and the cord 32. The first aluminum-containing material layer 16b has a thickness T, and a ratio of the distance D to the thickness T is between 0.125 and 0.16.

Figure 5:
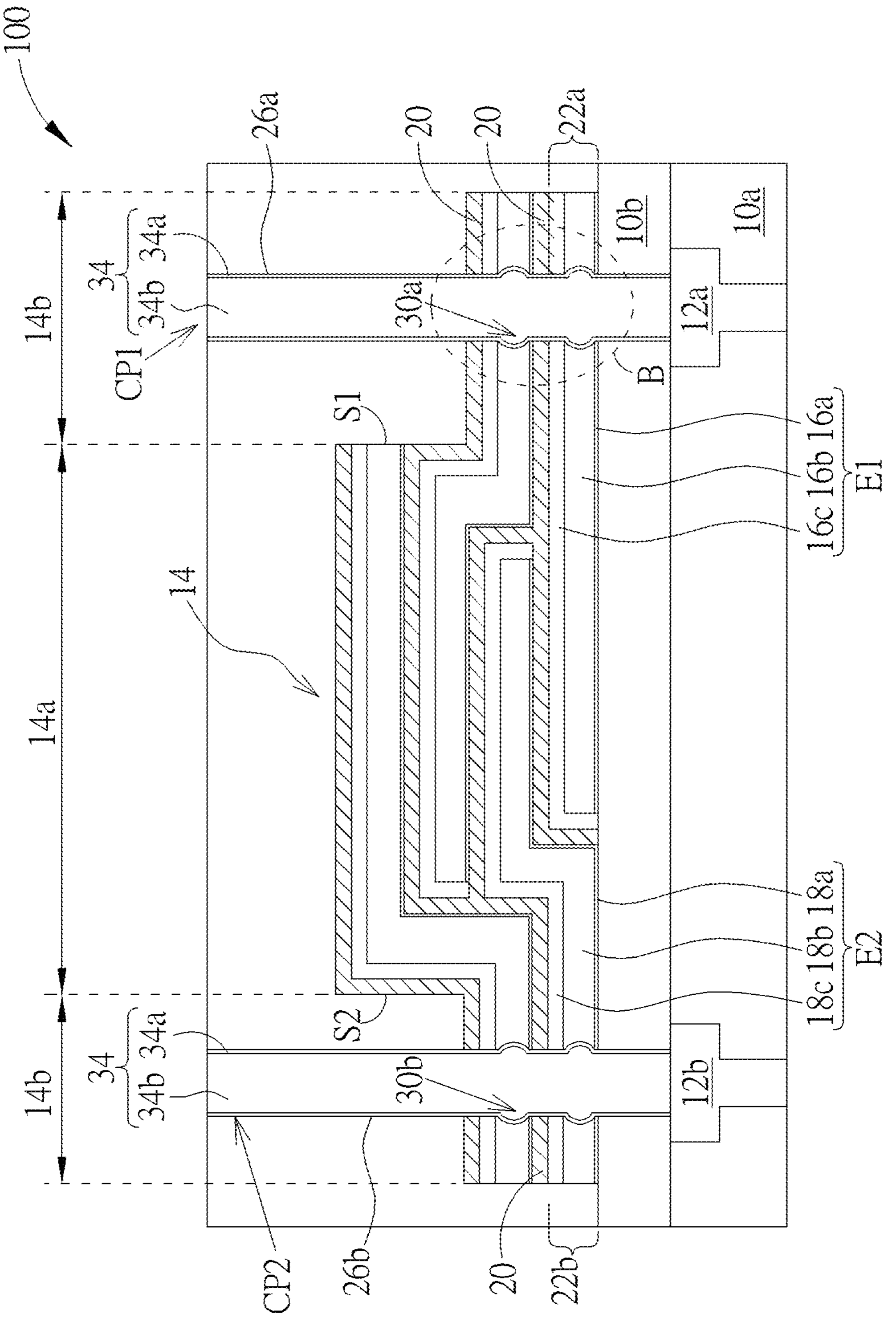

As shown in FIG. 5, a conductive layer 34 is formed to fill the first via hole 26a and the second via hole 26b. The conductive layer 34 located in the first via hole 26a serves as a first conductive plug CP1. The conductive layer 34 located in the second via hole 26b serves as a second conductive plug CP2. The first conductive plug CP1 contacts the metal interconnection 12a, and the second conductive plug CP2 contacts the metal interconnection 12b. Now, the MIM capacitor structure 100 of the present invention is completed.

Since the first conductive plug CP1 fills up the first via hole 26a, the first conductive plug CP1 follows the profile of the first via hole 26a. Similarly, the second conductive plug CP2 also follows to the profile of the second via hole 26b. Therefore, the first conductive plug CP1 has numerous first arcs 30a, and each first arc 30a is concave toward the first aluminum-containing material layer 16b. The second conductive plug CP2 has numerous second arcs 30b, and each second arc 30b is concave toward the second aluminum-containing material layer 18b. In addition, the step of forming the conductive layer 34 includes forming a buffer layer 34a to cover and contact the first via hole 26a, the second via hole 26b and the top surface of the dielectric layer 10*c*. Later, a metal layer 34*b* is formed to fill the first via hole 26*a,* the second via hole 26*b* and cover the top surface of the dielectric layer 10*c*. Then, the metal layer 34*b* and the buffer layer 34*a* are planarized to make the top surface of the first conductive plug CP1, the top surface of the second conductive plug CP2 and the top surface of the dielectric layer 10*c* aligned. The buffer layer 34*a* and the metal layer 34*b* can respectively formed by a chemical vapor deposition process. Moreover, the buffer layer 34*a* includes tungsten nitride, titanium nitride, tantalum or tantalum nitride, and the metal layer 34*b* includes copper, aluminum or tungsten.

Figure 7:
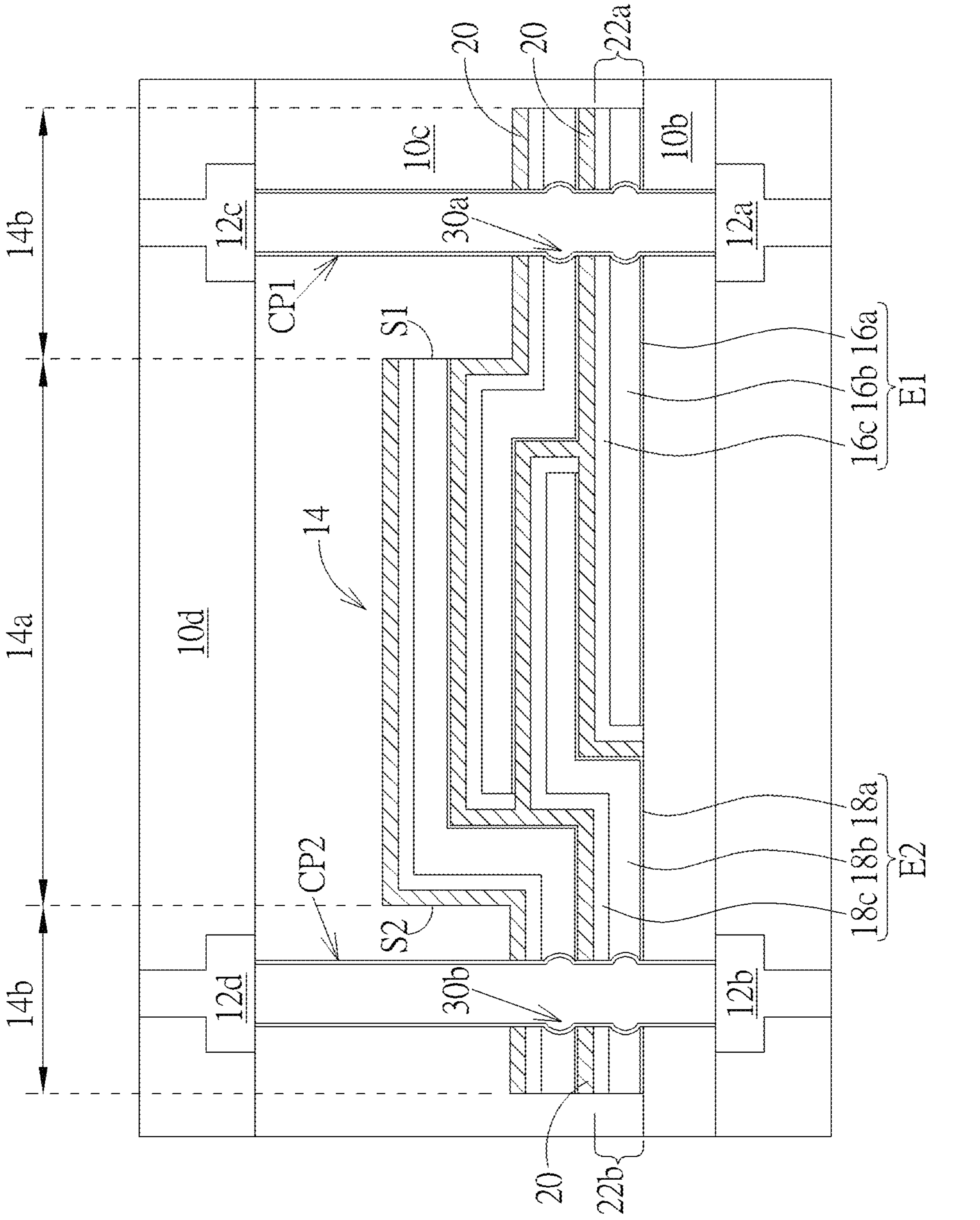

As shown in FIG. 7, a dielectric layer 10*d* is formed to cover the dielectric layer 10*c*. Later, metal interconnections 12*c*/12*d* are formed in dielectric layer 10*d*. The metal interconnection 12*c* contacts the first conductive plug CP1, and the metal interconnection 12*d* contacts the second conductive plug CP2. Furthermore, the above-mentioned dielectric layer 10*d* may include silicon oxide, silicon nitride or other low dielectric constant materials. Metal interconnections 12*a*/12*b*/12*c*/12*d* respectively includes copper, aluminum or tungsten.

As shown in FIG. 5, an MIM capacitor structure 100 includes a dielectric layer 10*b,* and a MIM capacitor body 14*a* is disposed on the dielectric layer 10*b*. The MIM capacitor body 14*b* includes a first electrode E1 and a second electrode E2 stacked alternately multiple times. A capacitor dielectric layer 20 is disposed between the first electrode E1 and the second electrode E2.

Because the first electrode E1 and the second electrode E2 stacked alternately several times, therefore, there are numerous first electrodes E1 and the second electrodes E2 in the MIM capacitor body 14*a*. Each first electrode E1 has a first extension part 22*a* extending from a first side S1 of the MIM capacitor body 14*a*. Each second electrode E2 has a second extension part 22*b* extending from a second side S2 of the MIM capacitor body 14*a*. The first side S1 and the second side S2 are opposite, and the first extension part 22*a* and the second extension part 22*b* do not overlap each other. There are numerous first extension part 22*a* stacked on the first side S1. A capacitor dielectric layer 20 is disposed between the first extension parts 22*a*. There are numerous second extension part 22*b* stacked on the second side S2. The capacitor dielectric layer 20 is disposed between the second extension parts 22*b*.

Each first extension part 22*a* includes a first aluminum-containing material layer 16*b,* and each second extension part 22*b* includes a second aluminum-containing material layer 18*b*. A first conductive plug CP1 penetrates through each of the first extension parts 22*a* and the capacitor dielectric layer 20 between the first extension parts 22*a*. The first conductive plug CP1 has numerous first arcs 30*a* respectively located in each first extension part 22*a*. The first arc 30*a* is concave toward the first aluminum-containing material layer 16*b* in the first extension parts 22*a*. A second conductive plug CP2 penetrates through each of the second extension parts 22*b* and the capacitor dielectric layer 20 between the second extension parts 22*b*. The second conductive plug CP2 has numerous second arcs 30*b* respectively located in each second extension part 22*b*. The second arc 30*b* is concave toward the second aluminum-containing material layer 18*b* in the second extension parts 22*b*.

Figure 6:
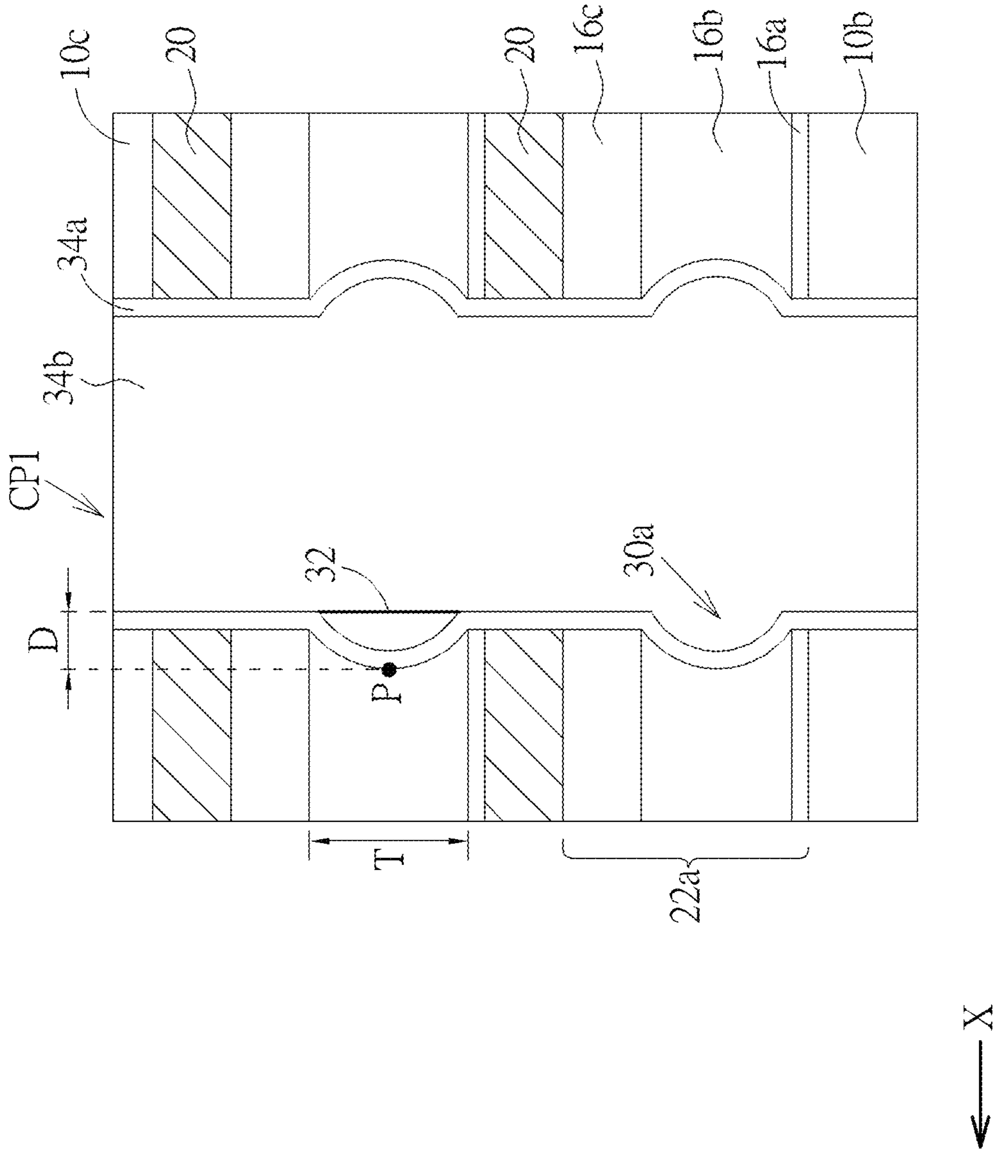

According to a preferred embodiment of the present invention, the first aluminum-containing material layer 16*b* is aluminum. The capacitor dielectric layer 20 includes silicon nitride, aluminum oxide, zirconium oxide, barium strontium titanate (BST), lead zirconate titanate (PZT), zirconium silicate ($ZrSiO_4$), and hafnium silicon oxide. ($HfSiO_2$), hafnium silicon oxynitride (HfSiON), tantalum oxide or a combination of the above materials FIG. 6 depicts a partial enlarged view of the first conductive plug CP2 in an area B of FIG. 5. The second conductive plug CP2 and the first conductive plug CP1 have the same structure; therefore please also refer to FIG. 6 for the profile of the second conductive plug CP2.

As shown in FIG. 6, a horizontal direction X is parallel to the top surface of the dielectric layer 10*b*. The first arc 30*a* has a cord 32. Along the horizontal direction X, the first arc 30*a* has a position P which is most concave to the first aluminum-containing material layer 16*b*. Along the horizontal direction X, there is a distance D between the position P and the cord 32. The first aluminum-containing material layer 16*b* has a thickness T, and a ratio of the distance D to the thickness T is between 0.125 and 0.16. According to a preferred embodiment of the present invention, the distance D is not greater than 25 nanometers, and the thickness T is between 150 and 200 nanometers.

The present invention forms arcs in the first electrode and the second electrode by wet etching processes so as to make the subsequently formed first conductive plug and second conductive plug also have arc profiles that are concave toward the first electrode and the second electrode. The arc can increase the surface areas of the first conductive plug and the second conductive plug. In this way, contact resistance between the first electrode and the first conductive plug, and contact resistance between the second electrode and the second conductive plug can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal-insulator-metal (MIM) capacitor structure, comprising:

a dielectric layer;

an MIM capacitor body disposed on the dielectric layer, wherein the MIM capacitor body comprises:

a first electrode and a second electrode stacked alternately; and a capacitor dielectric layer disposed between the first electrode and the second electrode; wherein the first electrode has a first extension part extending out from the MIM capacitor body, and the second electrode has a second extension part extending out from the MIM capacitor body, the first extension part comprises a first aluminum-containing material layer, and the second extension part comprises a second aluminum-containing material layer;

a first conductive plug penetrating the first extension part, wherein the first conductive plug has a first arc which is concave toward the first aluminum-containing material layer; and a second conductive plug penetrating the second extension part, wherein the second conductive plug has a second arc which is concave toward the second aluminum-containing material layer.

2. The MIM capacitor structure of claim 1, wherein the MIM capacitor body comprises the first electrode and the second electrode stacked alternately multiple times, a plurality of first extension parts extend from the MIM capacitor body, a plurality of second extension parts extend from the MIM capacitor body, the first conductive plug penetrates the plurality of first extension parts, and the second conductive plug penetrates the plurality of the second extension parts.

3. The MIM capacitor structure of claim 2, wherein the first arc is disposed in the first aluminum-containing material layer in each of the plurality of first extension parts, and the second arc is disposed in the second aluminum-containing material layer in each of the plurality of second extension parts.

4. The MIM capacitor structure of claim 1, wherein the first electrode further comprises a first titanium nitride layer, and the first titanium nitride layer contacts the first aluminum-containing material layer, and wherein the second electrode further comprises a second titanium nitride layer, and the second titanium nitride layer contacts the second aluminum-containing material layer.

5. The MIM capacitor structure of claim 1, wherein a horizontal direction parallel to a top surface of the dielectric layer, the first arc has a cord, the first arc has a position most concave to the first aluminum-containing material layer, and wherein along the horizontal direction, there is a distance between the position and the cord, the first aluminum-containing material layer has a thickness, and a ratio of the distance to the thickness is between 0.125 and 0.16.

6. The MIM capacitor structure of claim 5, wherein the distance is not greater than 25 nanometers, and the thickness is between 150 and 200 nanometers.

7. The MIM capacitor structure of claim 1, wherein the first extension part and the second extension part do not overlap each other.

8. The MIM capacitor structure of claim 1, wherein the first extension part extends from a first side of the capacitor body, the second extension part extends from a second side of the capacitor body, and the first side and the second side are opposite.

9. The MIM capacitor structure of claim 1, wherein the first aluminum-containing material layer is aluminum, and the second aluminum-containing material layer is aluminum.

10. A fabricating method of a metal-insulator-metal (MIM) capacitor structure, comprising:

forming an MIM capacitor body, wherein the MIM capacitor body comprises:

a first electrode and a second electrode stacked alternately; and a capacitor dielectric layer disposed between the first electrode and the second electrode; wherein the first electrode has a first extension part extending out from the MIM capacitor body, and the second electrode has a second extension part extending out from the MIM capacitor body, the first extension part comprises a first aluminum-containing material layer, and the second extension part comprises a second aluminum-containing material layer;

forming a dielectric layer to cover the MIM capacitor body, the first extension part and the second extension part;

performing a dry etching to form a first via hole and a second via hole, the first via hole penetrating through the dielectric layer, the first extension part and the capacitor dielectric layer, and the second via hole penetrating through the dielectric layer, the second extension part and the capacitor dielectric layer;

performing a wet etching to etch the first aluminum-containing material layer and the second aluminum-containing material layer to form a first arc in the first aluminum-containing material layer which is concave toward the first aluminum-containing material layer, and to form a second arc in the second aluminum-containing material layer which is concave toward the second aluminum-containing material layer; and forming a conductive layer to fill the first via hole and the second via hole.

11. The fabricating method of an MIM capacitor structure of claim 10, wherein an etchant used in the wet etching comprises alkali solution, amine solution, ACT solution, EKC solution or SC1 cleaning solution.

12. The fabricating method of an MIM capacitor structure of claim 10, wherein the MIM capacitor body comprises the first electrode and the second electrode stacked alternately multiple times, a plurality of first extension parts extend from the MIM capacitor body, a plurality of second extension parts extend from the MIM capacitor body, the first via hole penetrates the plurality of first extension parts, and the second via hole penetrates the plurality of the second extension parts.

13. The fabricating method of an MIM capacitor structure of claim 12, wherein the first arc is disposed in the first aluminum-containing material layer in each of the plurality of first extension parts, and the second arc is disposed in the second aluminum-containing material layer in each of the plurality of second extension parts.

14. The fabricating method of an MIM capacitor structure of claim 10, wherein the first electrode further comprises a first titanium nitride layer, and the first titanium nitride layer contacts the first aluminum-containing material layer, and wherein the second electrode further comprises a second titanium nitride layer, and the second titanium nitride layer contacts the second aluminum-containing material layer.

15. The fabricating method of an MIM capacitor structure of claim 10, wherein a horizontal direction parallel to a top surface of the dielectric layer, the first arc has a cord, the first arc has a position most concave to the first aluminum-containing material layer, and wherein along the horizontal direction, there is a distance between the position and the cord, the first aluminum-containing material layer has a thickness, and a ratio of the distance to the thickness is between 0.125 and 0.16.

16. The fabricating method of an MIM capacitor structure of claim 15, wherein the distance is not greater than 25 nanometers, and the thickness is between 150 and 200 nanometers.

* * * * *